(12) United States Patent
Lin et al.

(10) Patent No.: US 10,727,154 B2
(45) Date of Patent: Jul. 28, 2020

(54) COMPONENT COUPLED TO HEAT DISSIPATION UNIT

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 31 days.

(21) Appl. No.: 16/140,543

(22) Filed: Sep. 25, 2018

(65) Prior Publication Data

US 2019/0057927 A1 Feb. 21, 2019

Related U.S. Application Data

(63) Continuation of application No. 15/052,851, filed on Feb. 24, 2016, now abandoned.

(51) Int. Cl.
  *H01L 23/34* (2006.01)
  *H01L 23/40* (2006.01)
  *H01L 23/367* (2006.01)

(52) U.S. Cl.
  CPC .......... *H01L 23/4006* (2013.01); *H01L 23/34* (2013.01); *H01L 23/40* (2013.01); *H01L 23/3672* (2013.01); *H01L 2023/4075* (2013.01); *H01L 2023/4087* (2013.01)

(58) Field of Classification Search
  CPC .. H01L 23/3672; H01L 23/40; H01L 23/4006
  USPC ........................................................ 165/80.3
  See application file for complete search history.

(56) References Cited

U.S. PATENT DOCUMENTS

| 4,952,107 A | 8/1990 | Dupree |
| 6,112,378 A | 9/2000 | Lee |
| 6,307,748 B1 | 10/2001 | Lin et al. |
| 6,412,546 B1 * | 7/2002 | Lin ................... H01L 23/3672 165/185 |
| 7,903,421 B2 * | 3/2011 | Lv ....................... H01L 23/4093 165/185 |

(Continued)

FOREIGN PATENT DOCUMENTS

| CN | 1628217 A | 6/2005 |
| CN | 101568246 A | 10/2009 |

*Primary Examiner* — Elizabeth J Martin
*Assistant Examiner* — Nael N Babaa
(74) *Attorney, Agent, or Firm* — Bradley J. Thorson; DeWitt LLP

(57) ABSTRACT

A component coupled to a heat dissipation unit, allowing a screwing element to be pivotally coupled to a heat dissipation unit, includes a body, a stop portion, a first inner engagement portion, a second inner engagement portion and a first outer engagement portion. The body has a first part and a second part and forms therein a through hole which extends axially. The stop portion is circumferentially disposed at the rim of the first or second part. The first inner engagement portion has checking plates and corresponds in position to the stop portion. The second inner engagement portion has stop blocks disposed at the first or second part. The first outer engagement portion is disposed at the rim of the body and opposite the stop portion. The screwing element is fixed to the heat dissipation unit temporarily but firmly, thereby preventing disintegration and disconnection during transport.

1 Claim, 15 Drawing Sheets

(56) References Cited

U.S. PATENT DOCUMENTS

| | | |
|---|---|---|
| 8,511,956 B2 | 8/2013 | Liu et al. |
| 2008/0106869 A1* | 5/2008 | Li ........................ H01L 23/4093 361/704 |
| 2009/0034200 A1* | 2/2009 | Li ........................ H01L 23/4006 361/704 |
| 2011/0286813 A1 | 11/2011 | Szczukowski et al. |
| 2012/0188723 A1* | 7/2012 | Liu ........................... G06F 1/20 361/720 |

* cited by examiner

COMPONENT COUPLED TO HEAT DISSIPATION UNIT

The present application is a continuation application of U.S. patent application Ser. No. 15/052,851, filed on Feb. 24, 2016.

BACKGROUND OF THE INVENTION

1. Technical Field

The present invention relates to components coupled to a heat dissipation unit and more particularly to a component coupled to a heat dissipation unit, fit to fix temporarily to the heat dissipation unit a screwing element for fixing a screw to the heat dissipation unit, and effective in preventing disintegration and disconnection during the transport of the heat dissipation unit.

2. Description of Related Art

Electronic components inside existing electronic apparatuses in operation generate heat; hence, the electronic apparatuses must be equipped with heat dissipation units to enhance the efficiency of heat dissipation with a view to preventing the electronic components from getting damaged when overheated. Hence, a heat-dissipating fin unit or a heat sink operates in conjunction with at least a cooling fan which ensures the heat dissipation of the heat dissipation unit to enhance overall heat dissipation performance. Both the conventional heat-dissipating fin unit and the conventional heat sink must be firmly mounted on the heat-generating electronic components with a support structure to transfer heat and dissipate heat efficiently.

Various ways are designed to buckle or screw different heat dissipation units to each other for the sake of assembly, for example, fixing the cooling fan and the heat sink in place by a heat sink stand or a fan frame, then inserting screwing elements, such as screws, simultaneously into holes formed on two heat dissipation units and the frame and formed with internal threads, and eventually tightening the screws to thereby put two heat dissipation units together or fixing one of the heat dissipation units to a heat source directly.

It is impossible to fix the screwing elements to the heat dissipation units before transporting the heat dissipation units. In practice, it is only when an assembly process is ready to begin that the screwing elements are inserted into the heat dissipation units and tightened. The screwing elements will be likely to get disconnected from the heat dissipation units during the transport thereof, if the screwing elements are inserted into the holes of the heat dissipation units but cannot be fixed thereto. If the screwing elements are disposed on an electronic apparatus substrate, the detached screwing elements will cause the electronic apparatuses substrate to develop a short circuit and thus end up in a failure or get damaged.

Furthermore, a person skilled in the art provides a clamp structure for temporarily clamping a screwing element to prevent the disconnection of the screwing element from a heat dissipation unit. However, the clamp structure must be customized, thereby lacking universal applicability. The lack of universal applicability poses a problem to the clamp structure, even though the clamp structure is effective in preventing the disconnection of the screwing element from the heat dissipation unit. The aforesaid conventional support structure has drawbacks as follows:

1. lacking universal applicability;
2. getting disconnected during transport; and
3. incurring die development costs.

SUMMARY OF THE INVENTION

To overcome the aforesaid drawbacks of the prior art, it is an objective of the present invention to provide a component coupled to a heat dissipation unit and adapted to prevent the disconnection of screwing elements from the heat dissipation unit during the transport thereof.

In order to achieve the above and other objectives, the present invention provides a component coupled to a heat dissipation unit, allowing a screwing element to be pivotally coupled to a heat dissipation unit, the component comprising a body, a stop portion, a first inner engagement portion, a second inner engagement portion, and a first outer engagement portion.

The body has a first part and a second part, with the first and second parts connected to each other and disposed at two ends of the body, respectively, the body forming therein a through hole extending axially to penetrate the first and second parts of the body. The stop portion is circumferentially disposed at the rim of one of the first and second parts selectively. The first inner engagement portion has a plurality of checking plates. The checking plates each extend from a through-hole-defining inner wall of the body to the center of the through hole radially, with the first inner engagement portion corresponding in position to the stop portion.

The first outer engagement portion is disposed opposite the stop portion and formed by extending the rim of the body outward.

According to the present invention, the component coupled to a heat dissipation unit ensures that screwing elements whereby a heat dissipation unit is to be screwed in place will not get disconnected during the transport of the heat dissipation unit, ensures that the component coupled to a heat dissipation unit will be universally applicable to heat dissipation units, and saves the manufacturing costs which may otherwise be incurred in duplicate development of dies.

DETAILED DESCRIPTION OF THE EMBODIMENT OF THE INVENTION

The aforesaid objective, structural features and functional features of the present invention are hereunder illustrated with preferred embodiments depicted with the accompany drawings.

Figure 1:
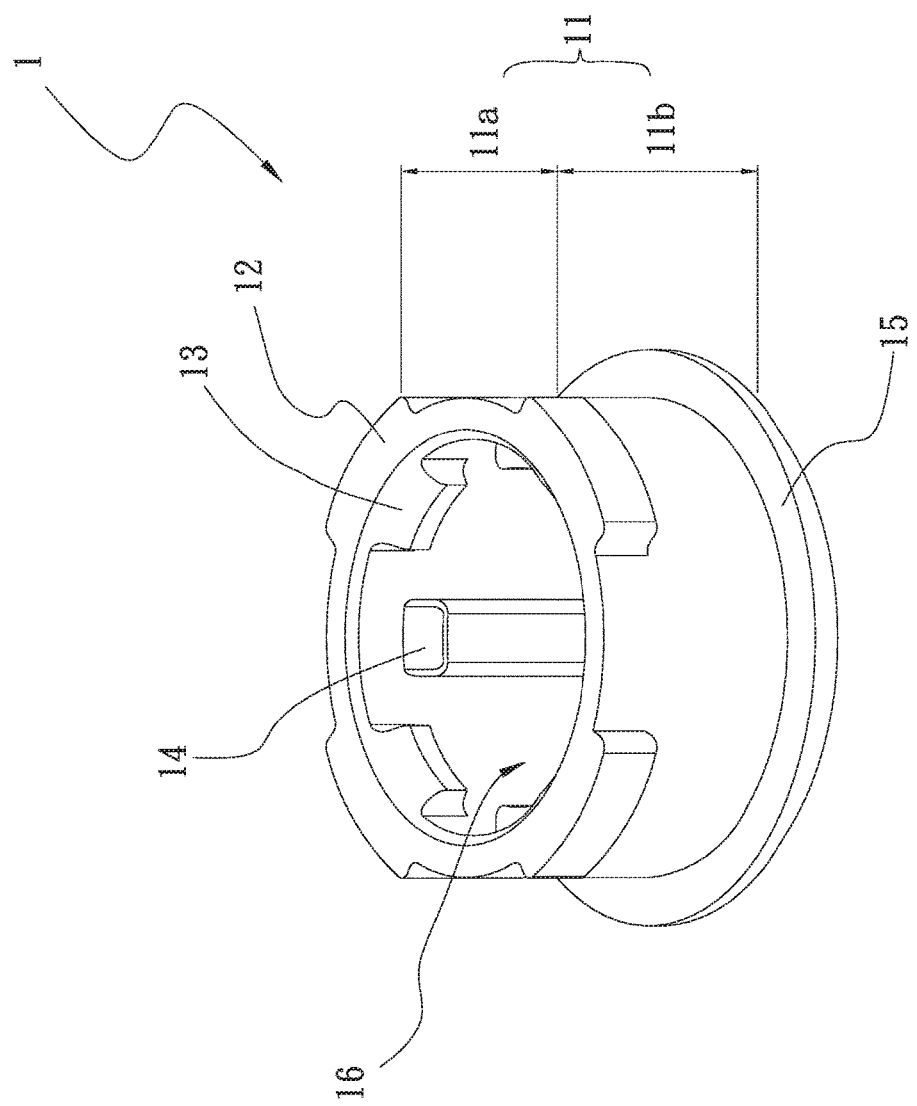
FIG. 1 is a perspective view of a component coupled to a heat dissipation unit according to the first embodiment of the present invention.
Figure 2:
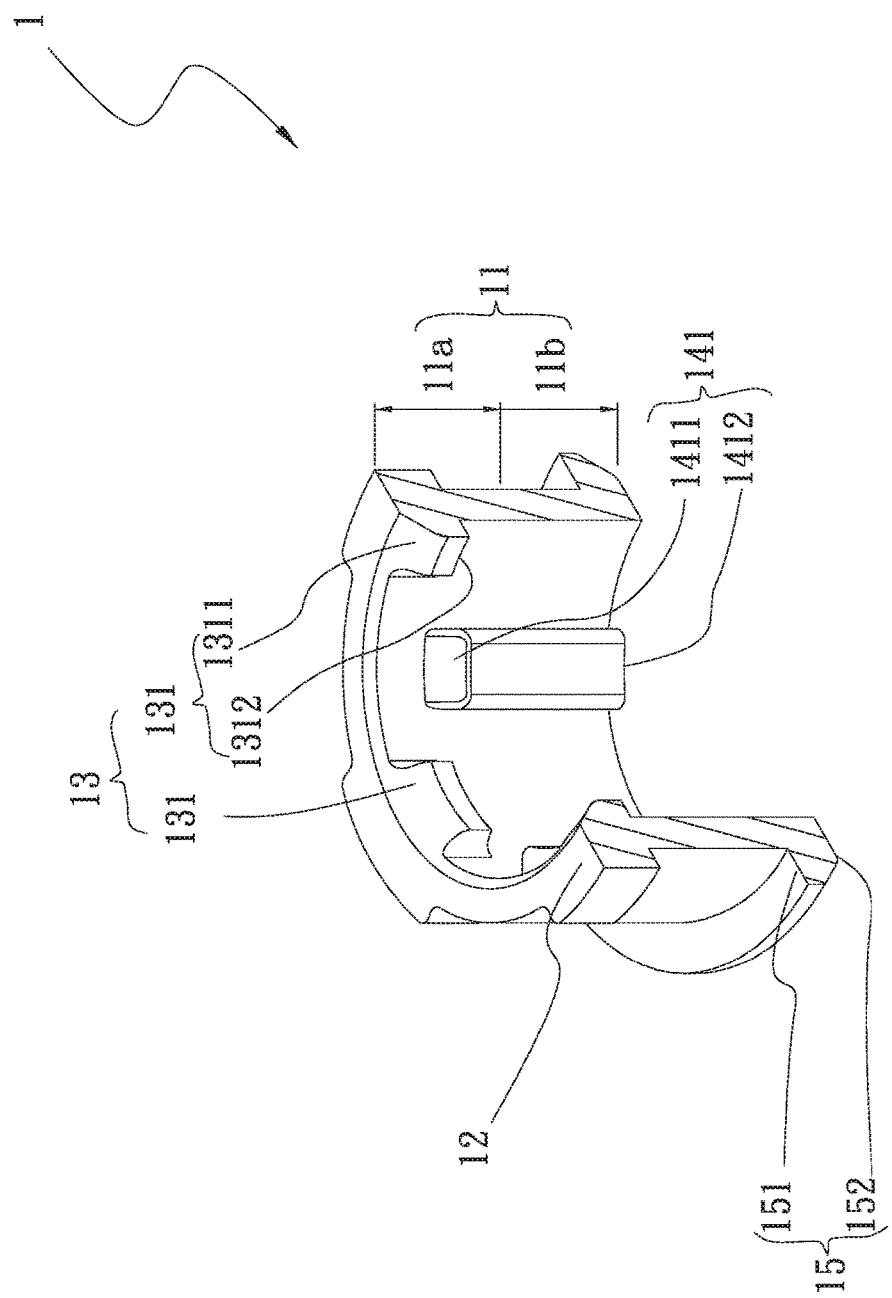
FIG. 2 is a cutaway view of the component coupled to a heat dissipation unit according to the first embodiment of the present invention.
Figure 3:
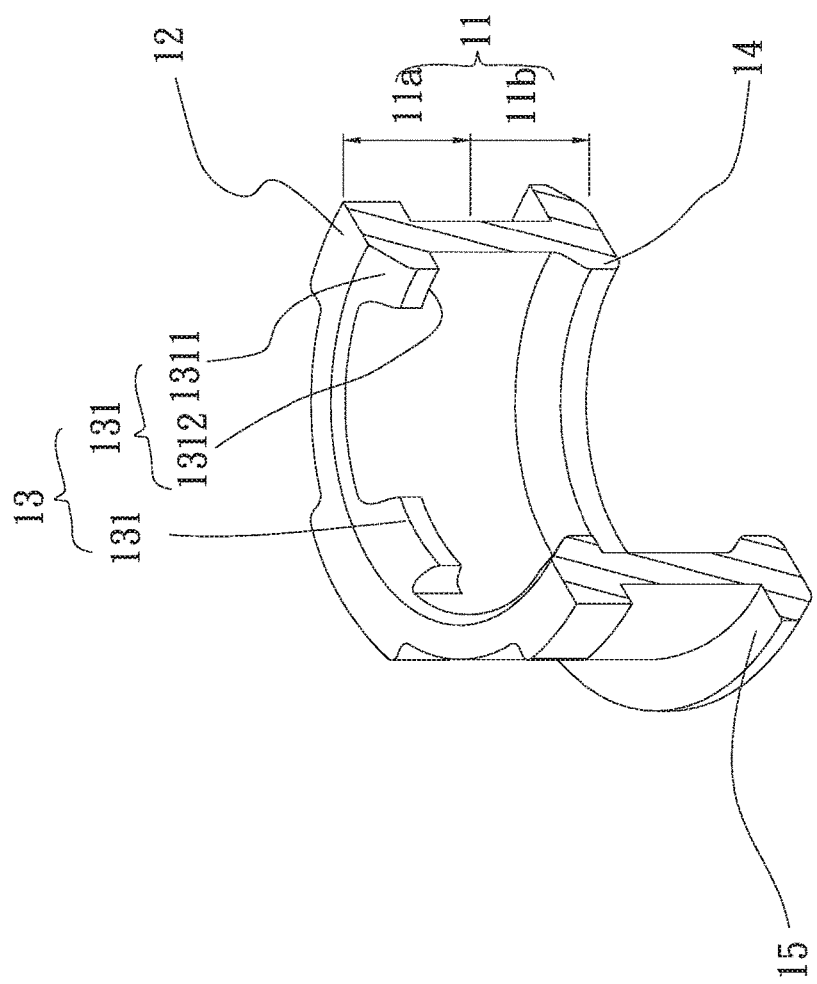
FIG. 3 is a cutaway view of the component coupled to a heat dissipation unit according to the first embodiment of the present invention.

Referring to FIGS. 1, 2 and 3, there are shown a perspective view and two cutaway views of a component coupled to a heat dissipation unit according to the first embodiment of the present invention, respectively. As shown in the diagrams, a component 1 coupled to a heat dissipation unit comprises a body 11, a stop portion 12, a first inner engagement portion 13, a second inner engagement portion 14, and a first outer engagement portion 15.

The body 11 has a first part 11a and a second part 11b. The first and second parts 11a, 11b are connected to each other. The first and second parts 11a, 11b are disposed at two ends of the body 11, respectively. The body 11 forms therein a through hole 16 which extends axially. The through hole 16 penetrates the first and second parts 11a, 11b of the body 11.

The stop portion 12 is circumferentially disposed at the rim of one of the first and second parts 11a, 11b selectively. For illustrative sake, in this embodiment, the stop portion 12 is circumferentially disposed at the rim of the free end of the first part 11a of the body 11, but the present invention is not limited thereto. The stop portion 12 is selectively continuously circumferential or discontinuously circumferential, and it is discontinuously circumferential in this embodiment for illustrative sake, but the present invention is not limited thereto.

The first inner engagement portion 13 has a plurality of checking plates 131. The checking plates 131 each extend from the inner wall (which defines the through hole 16 and is hereinafter referred to as the "through-hole-defining inner wall") of the body 11 to the center of the through hole 16 radially, with the first inner engagement portion 13 corresponding in position to the stop portion 12. The checking plates 131 each have a first end surface 1311 and a second end surface 1312 which face upward and downward substantially, respectively, and one of the first and second end surfaces 1311, 1312 is oblique.

The second inner engagement portion 14 is selectively disposed at one of the first and second parts 11a, 11b and has a plurality of stop blocks 141. The stop blocks 141 each extend from the through-hole-defining inner wall of the body 11 to the center of the through hole 16 radially. In this embodiment, the stop blocks 141 each extend from the through-hole-defining inner wall (i.e., the inner side of the first part 11a through the inner side of the second part 11b) of the body 11 and, in particular, extend axially from the first part 11a to the second part 11b. The stop blocks 141 each have a first top surface 1411 and a second top surface 1412 which are disposed at two ends of the stop blocks 141, respectively. One of the first and second top surfaces 1411, 1412 is oblique. Referring to FIG. 3, in another embodiment, the second inner engagement portion 14 is circumferentially disposed at the end of the second part 11b.

The first outer engagement portion 15 is disposed opposite the stop portion 12 and formed by extending the rim of the body 11 outward. In this embodiment, the stop portion 12 is disposed at the rim of the free end of the first part 11a, and thus the first outer engagement portion 15 is disposed at the rim of the free end of the second part 11b. The first outer engagement portion 15 has a first surface 151 and a second surface 152. The second surface 152 is curved or oblique. In this embodiment, the second surface 152 is curved for illustrative sake, but the present invention is not limited thereto.

Figure 4:
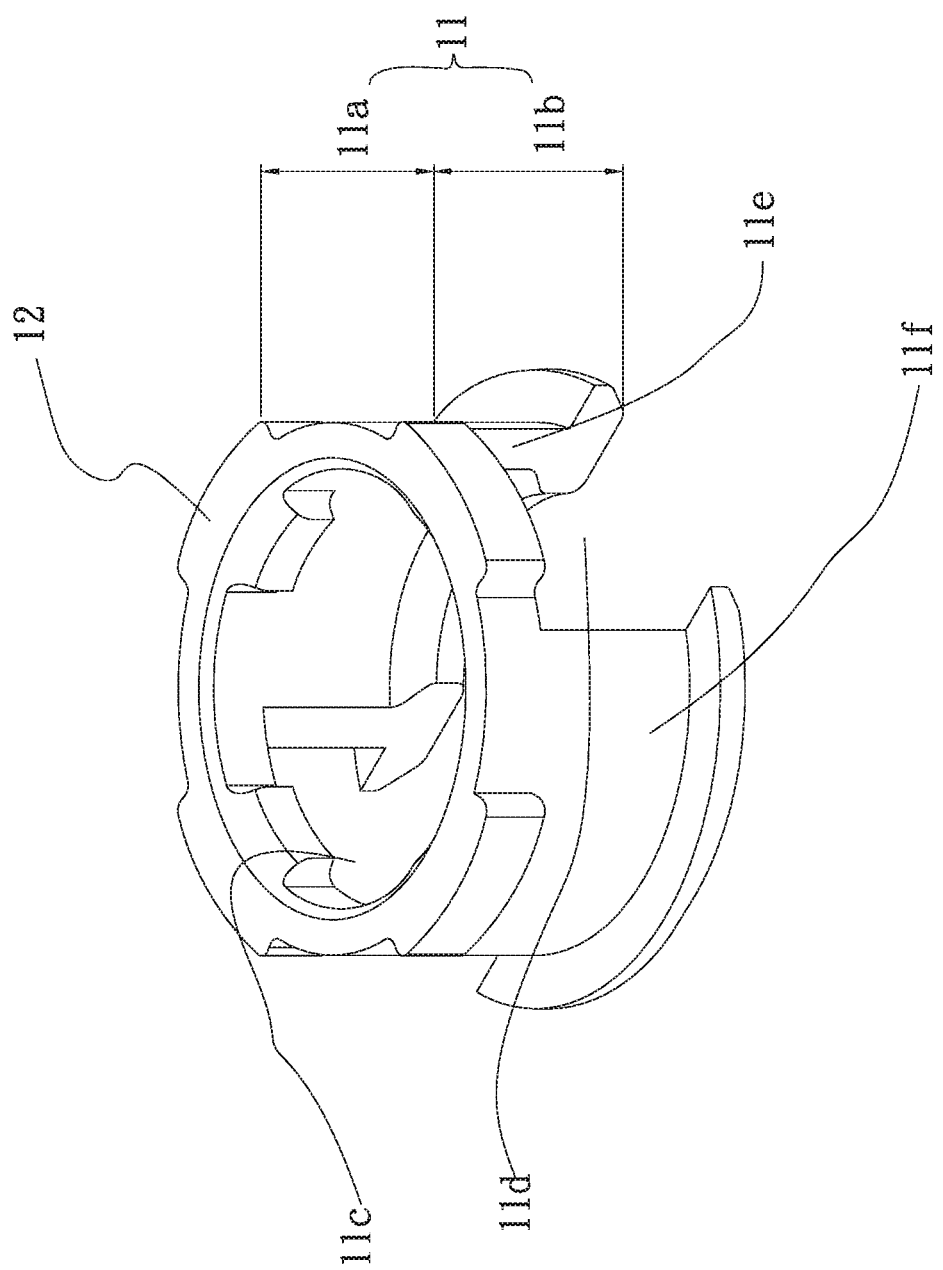
FIG. 4 is a perspective view of the component coupled to a heat dissipation unit according to the second embodiment of the present invention.

Referring to FIG. 4, there is shown a perspective view of the component coupled to a heat dissipation unit according to the second embodiment of the present invention. As shown in the diagram, the second embodiment and the first embodiment share the same technical features, except that the second embodiment is characterized in that: at least a first axial slot 11c and a second axial slot 11d are disposed at the second part 11b of the body 11, positioned opposite the stop portion 12 (i.e., the first part 11a) and corresponding to each other; the first and second axial slots 11c, 11d are disposed at the rim of the body 11, extend axially, and are in communication with the through hole 16 of the body 11; and the first and second axial slots 11c, 11d define a first clasp portion 11e and a second clasp portion 11f at the rim of the body 11.

Figure 5:
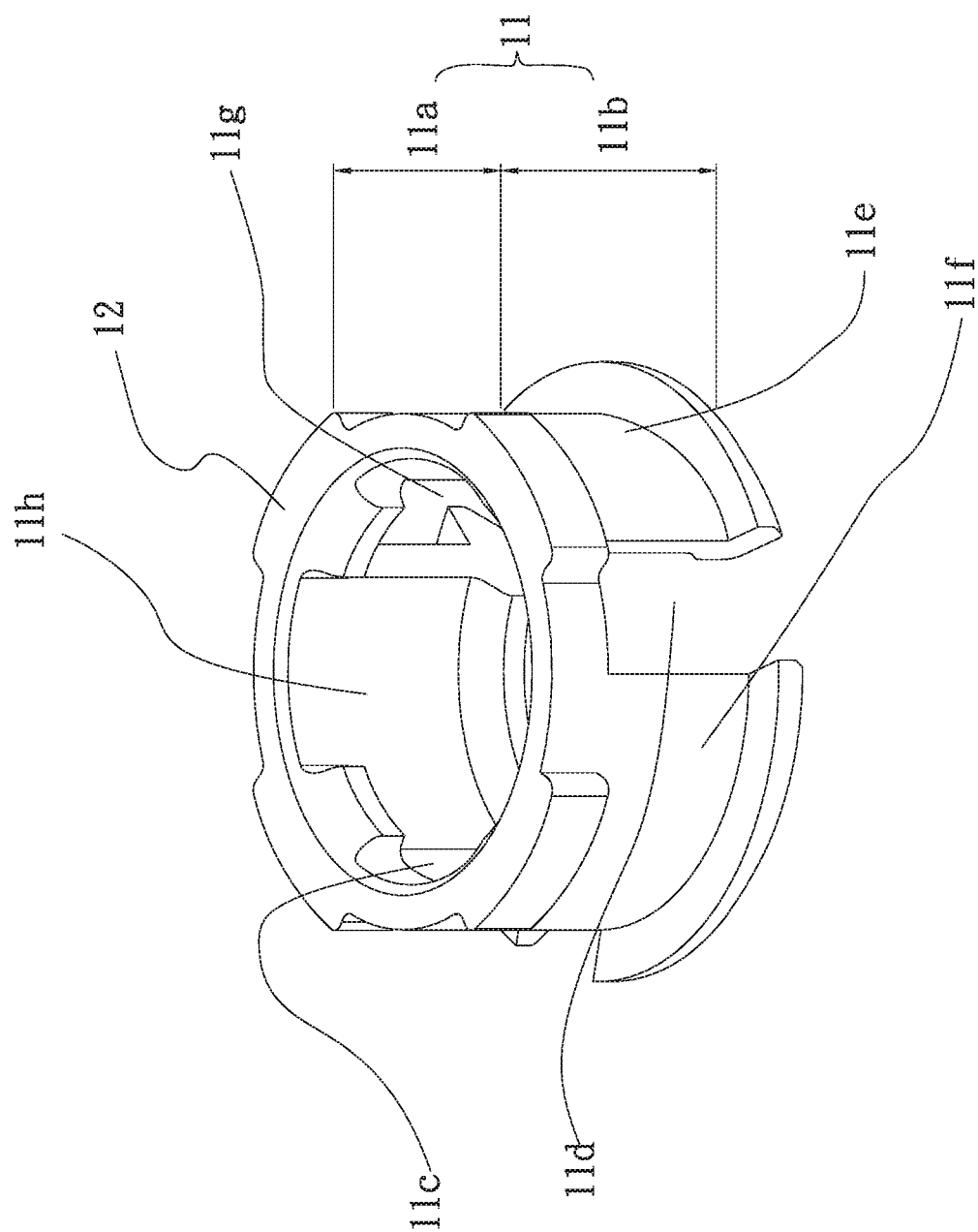
FIG. 5 is a perspective view of the component coupled to a heat dissipation unit according to the third embodiment of the present invention.

Referring to FIG. 5, there is shown a perspective view of the component coupled to a heat dissipation unit according to the third embodiment of the present invention. As shown in the diagram, the third embodiment and the first embodiment share the same technical features, except that the third embodiment is characterized in that: at least a first axial slot 11c, a second axial slot 11d and a third axial slot 11g are disposed at the second part 11b of the body 11, positioned opposite the stop portion 12 (i.e., the first part 11a) and angularly spaced apart by 120° or any other angle; the first, second and third axial slots 11c, 11d, 11g are disposed at the rim of the body 11, extend axially, and are in communication with the through hole 16 of the body 11; and the first, second and third axial slots 11c, 11d, 11g define a first clasp portion 11e, a second clasp portion 11f and a third clasp portion 11h at the rim of the body 11.

Figure 6:
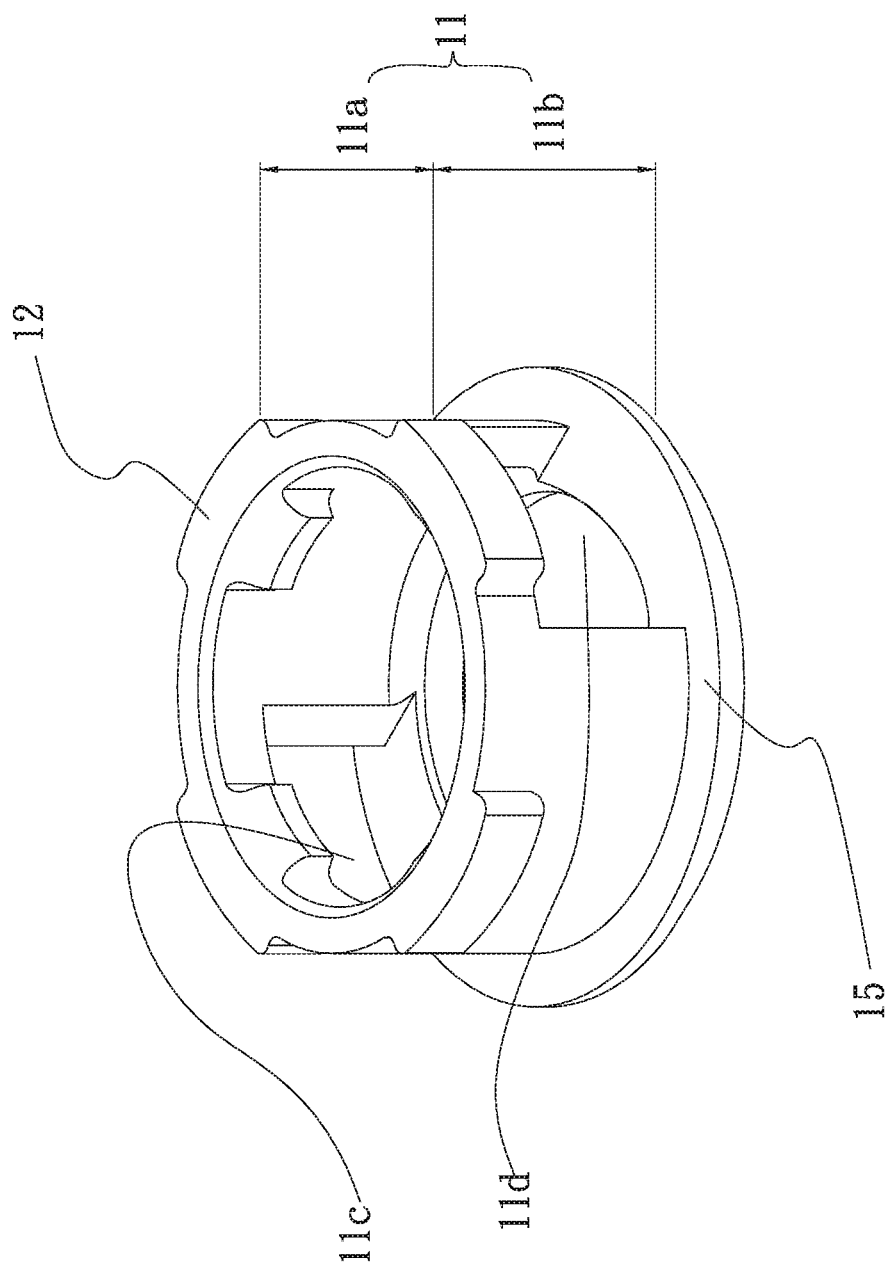
FIG. 6 is a perspective view of the component coupled to a heat dissipation unit according to the fourth embodiment of the present invention.

Referring to FIG. 6, there is shown a perspective view of the component coupled to a heat dissipation unit according to the fourth embodiment of the present invention. As shown in the diagram, the fourth embodiment and the second embodiment share the same technical features, except that the fourth embodiment is characterized in that: at least a first axial slot 11c and a second axial slot 11d are disposed at the second part 11b of the body 11, positioned opposite the stop portion 12 (i.e., the first part 11a) and corresponding to each other; the first and second axial slots 11c, 11d are disposed at the rim of the body 11, extend axially, and are in communication with the through hole 16 of the body 11; and the first and second axial slots 11c, 11d do not fully penetrate the second part 11b of the body 11 axially, thereby allowing the first outer engagement portion 15 to be circumferentially disposed at the end of the second part 11b fully.

It is also feasible that the axial slots in the second, third and fourth embodiments are in the number of four or more, but the present invention is not limited thereto.

Figure 7:
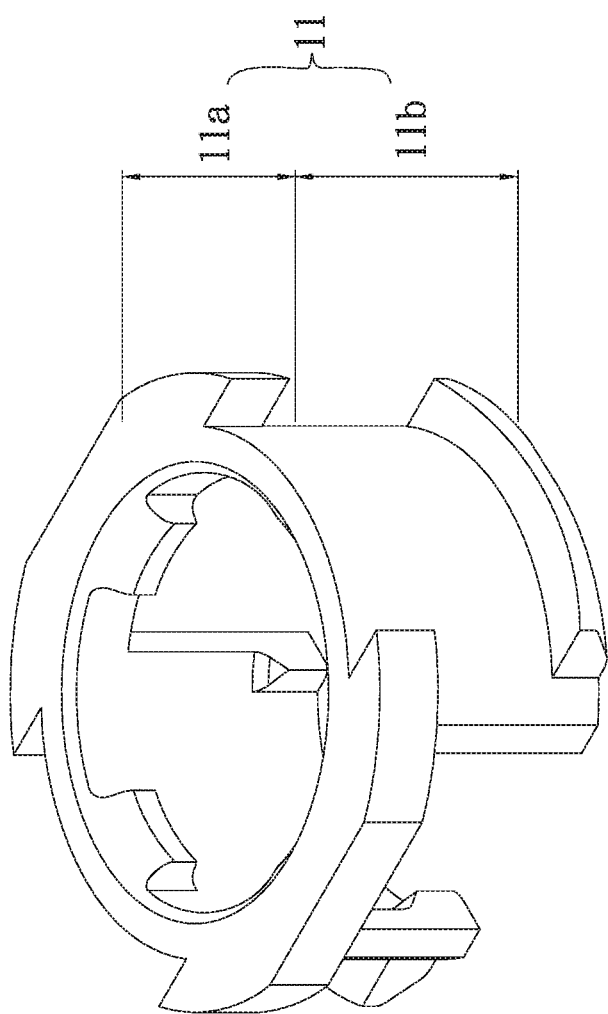
FIG. 7 is a perspective view of the component coupled to a heat dissipation unit according to the fifth embodiment of the present invention.

Referring to FIG. 7, there is shown a perspective view of the component coupled to a heat dissipation unit according to the fifth embodiment of the present invention. As shown in the diagram, the fifth embodiment and the first embodiment share the same technical features, except that the fifth embodiment is characterized in that: all cross sections of the first and second parts 11a, 11b of the body are non-round; for illustrative sake, the fifth embodiment is exemplified by the second part 11b with non-round cross sections, but the present invention is not limited thereto, as it is also feasible that the cross sections of the second part 11b are elliptical, square, trapezoidal or polygonal; and whatever structure which matches the second part 11b must have cross sections which match the cross sections of the second part 11b to prevent the second part 11b from rotating radially relative to the structure.

Figure 8:
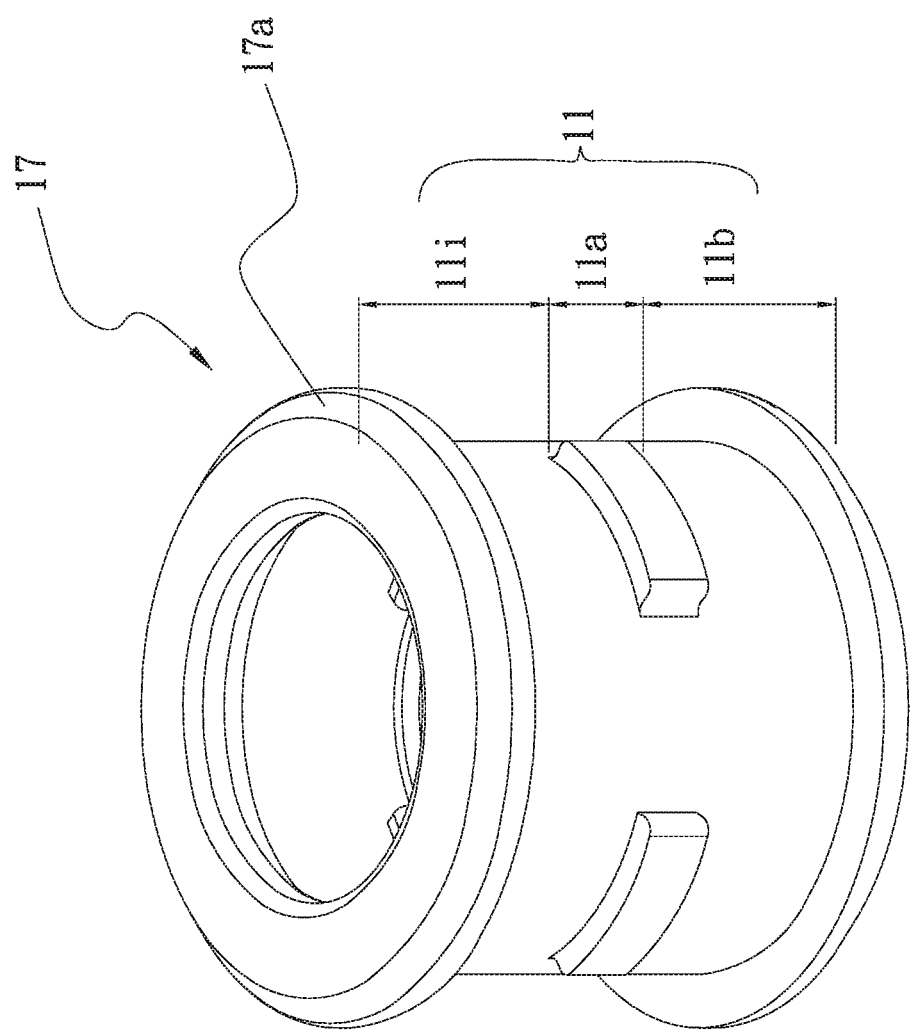
FIG. 8 is a perspective view of the component coupled to a heat dissipation unit according to the sixth embodiment of the present invention.

Referring to FIG. 8, there is shown a perspective view of the component coupled to a heat dissipation unit according to the sixth embodiment of the present invention. As shown in the diagram, the sixth embodiment and the first embodiment share the same technical features, except that the sixth embodiment is characterized in that: the body 11 further has a third part 11i and a second outer engagement portion 17; the third part 11i is connected to the first part 11a; the second outer engagement portion 17 is disposed at the rim of the free end of the third part 11i and formed by extending the rim of the free end of the third part 11i outward; and the second outer engagement portion 17 has at least a conical surface 17a disposed on the top surface of the second outer engagement portion 17.

Figure 9:
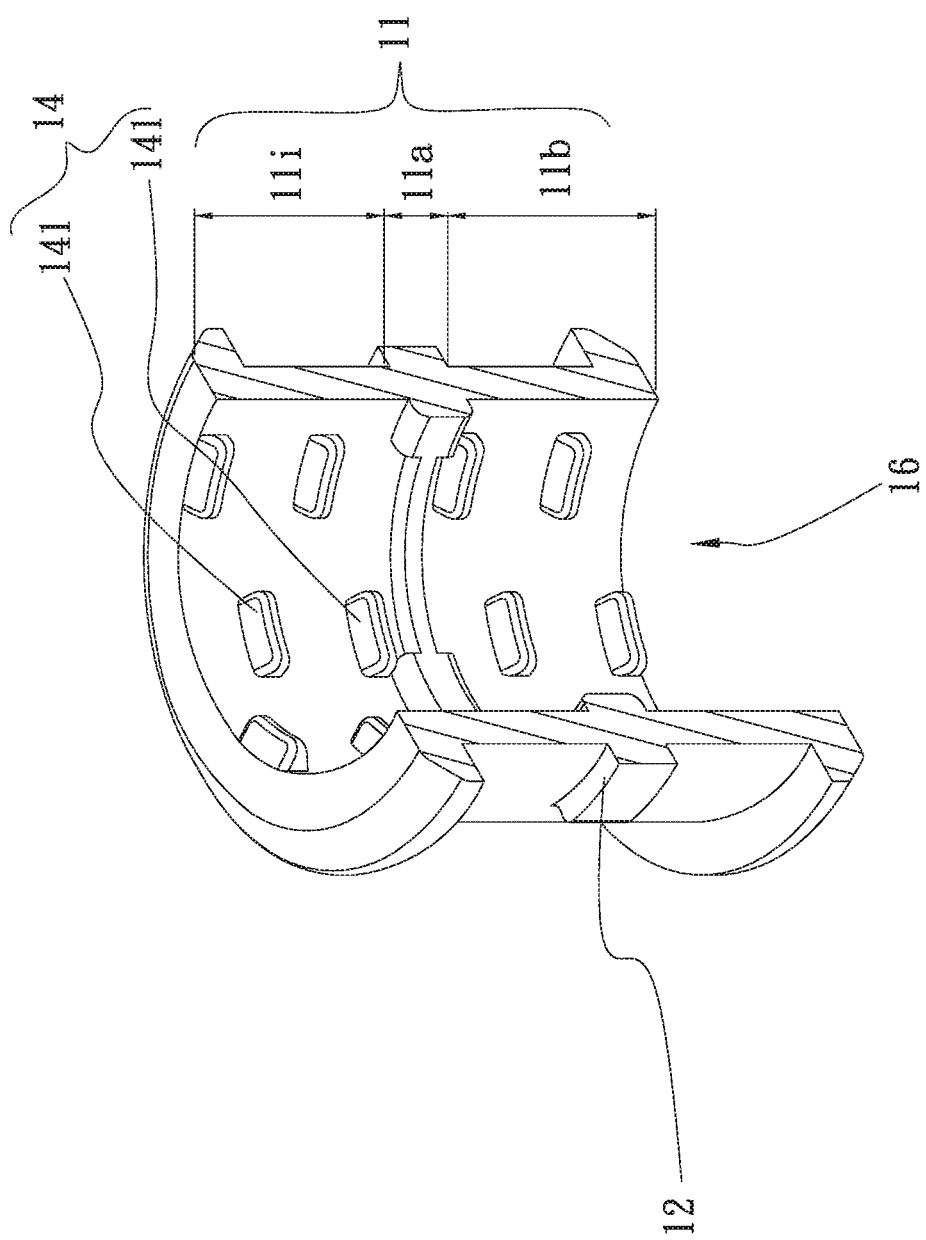
FIG. 9 is a cutaway view of the component coupled to a heat dissipation unit according to the seventh embodiment of the present invention.
Figure 10:
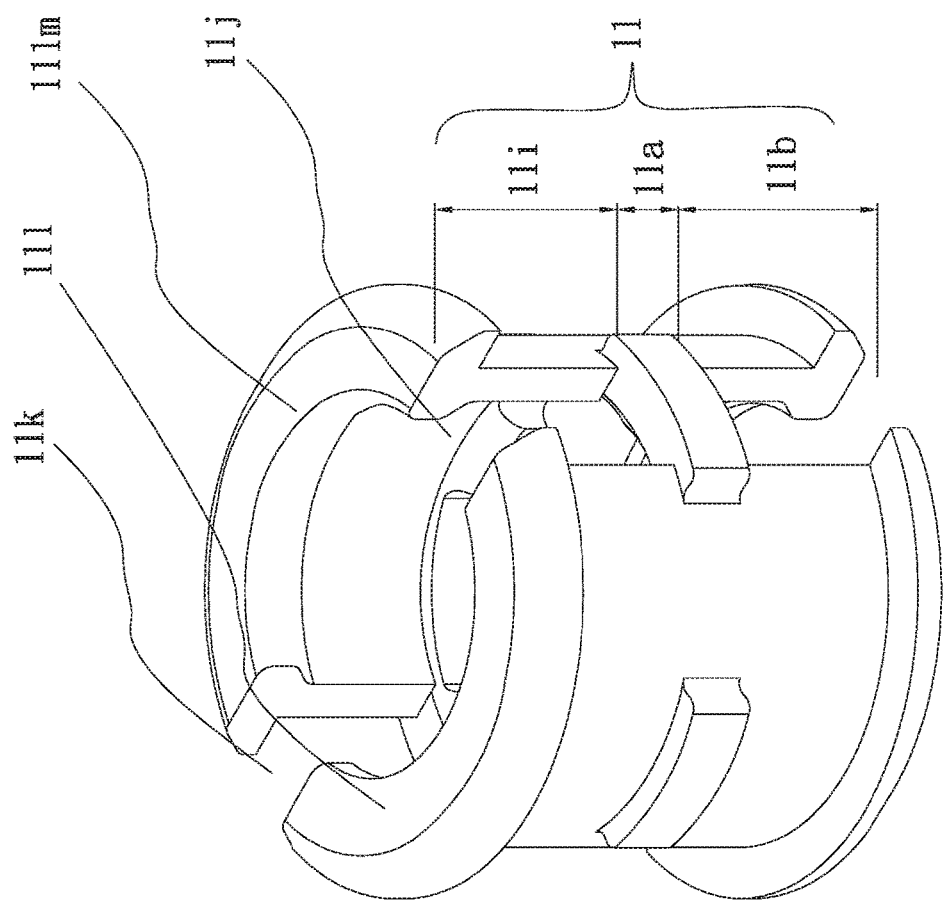
FIG. 10 is a perspective view of the component coupled to a heat dissipation unit according to the eighth embodiment of the present invention.

Referring to FIG. 9, there is shown a cutaway view of the component coupled to a heat dissipation unit according to the seventh embodiment of the present invention. As shown in the diagram, the seventh embodiment and the fourth embodiment share the same technical features, except that the seventh embodiment is characterized in that the stop blocks 141 are disposed between the first and third parts 11a, 11i and disposed on the through-hole-defining inner wall surface of the body 11 in a continuous axial manner or a discontinuous axial manner. Referring to FIG. 10, there is shown a perspective view of the component coupled to a heat dissipation unit according to the eighth embodiment of the present invention. As shown in the diagram, the eighth embodiment and the sixth embodiment share the same technical features, except that the eighth embodiment is characterized in that: at least a fifth axial slot 11j and a sixth axial slot 11k are disposed at the third part 11i of the body 11, positioned opposite the stop portion 12 (i.e., the first part 11a) and corresponding to each other; the fifth and sixth axial slots 11j, 11k are disposed at the body 11 the rim, extend axially, and are in communication with the through hole 16 of the body 11; and the fifth and sixth axial slots 11j, 11k define a fifth clasp portion 11l and a sixth clasp portion 11m at the rim of the body 11.

Figure 11:
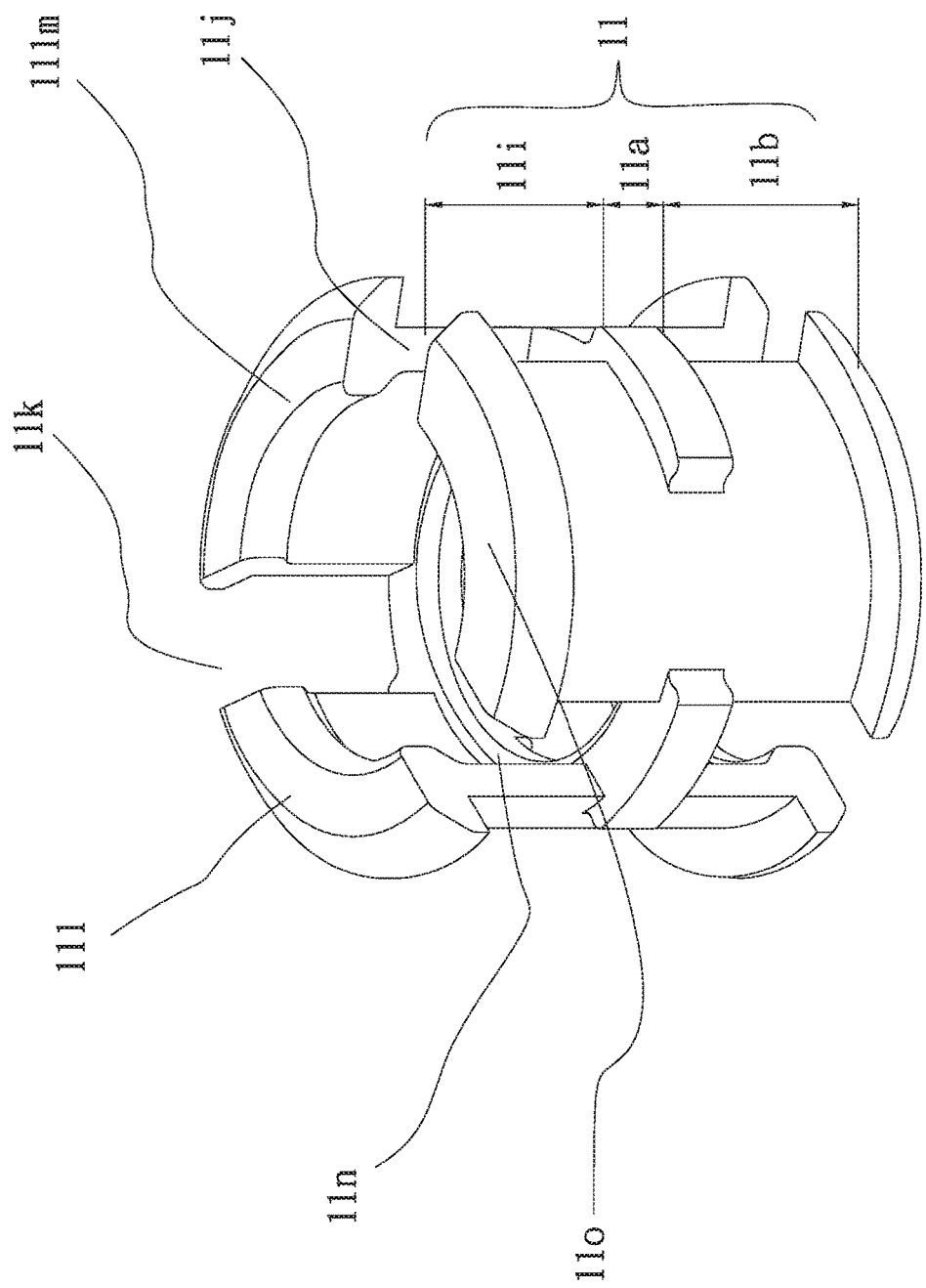
FIG. 11 is a perspective view of the component coupled to a heat dissipation unit according to the ninth embodiment of the present invention.

Referring to FIG. 11, there is shown a perspective view of the component coupled to a heat dissipation unit according to the ninth embodiment of the present invention. As shown in the diagram, the ninth embodiment and the sixth embodiment share the same technical features, except that the ninth embodiment is characterized in that: at least a fifth axial slot 11j, a sixth axial slot 11k and a seventh axial slot 11n are disposed at the third part 11i of the body 11, positioned opposite the stop portion 12 (i.e., the first part 11a) and angularly spaced apart by 120° or any other angle; the fifth, sixth and seventh axial slots 11j, 11k, 11n are disposed at the rim of the body 11, extend axially, and are in communication with the through hole 16 of the body 11; and the fifth, sixth and seventh axial slots 11j, 11k, 11n define a fifth clasp portion 11l, a sixth clasp portion 11m and a seventh clasp portion 11o at the rim of the body 11.

It is also feasible that the axial slots in the sixth, seventh, eighth, and ninth embodiments are in the number of four or more, but the present invention is not limited thereto.

Figure 12:
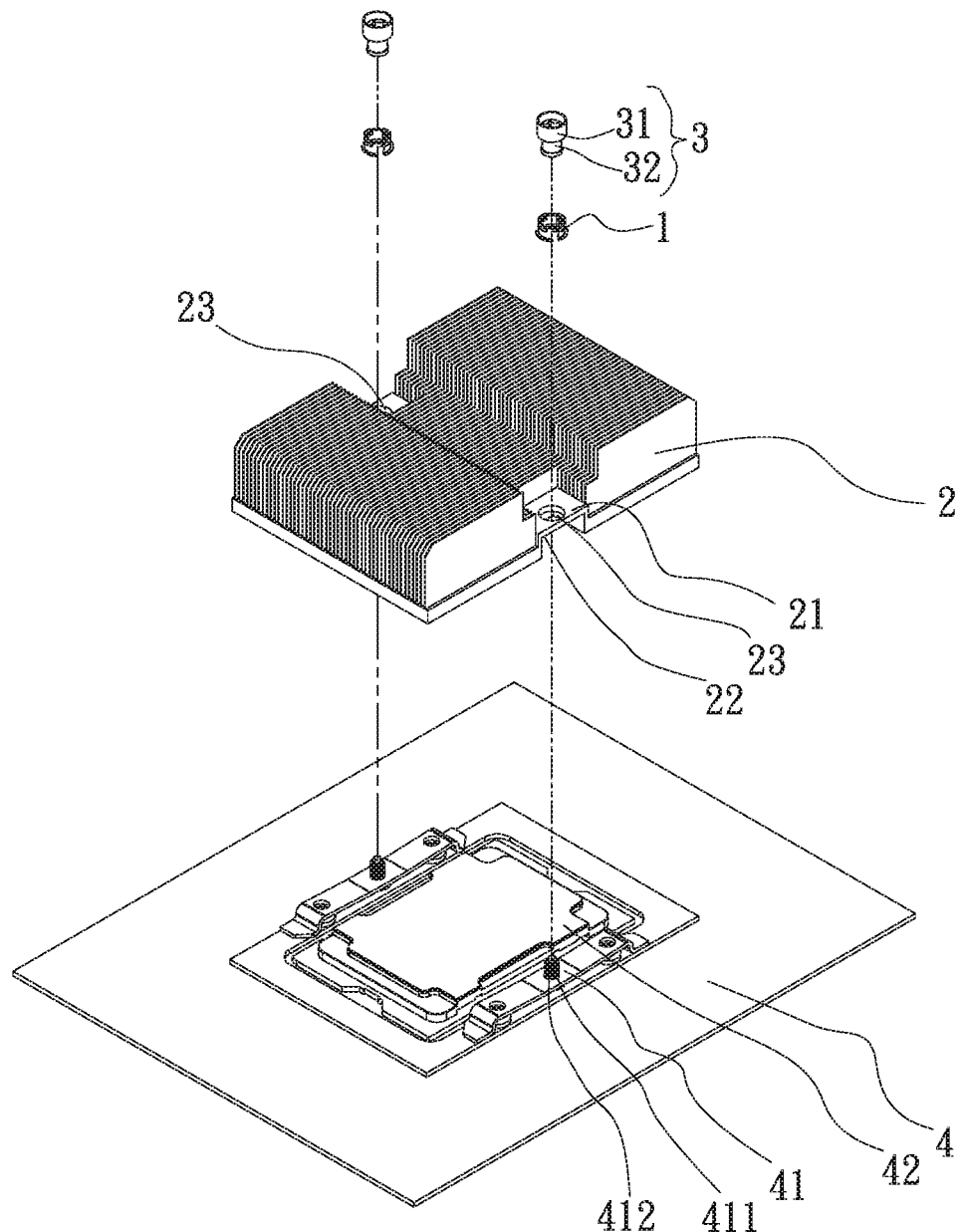
FIG. 12 is a schematic view of the operation of the present invention.
Figure 13:
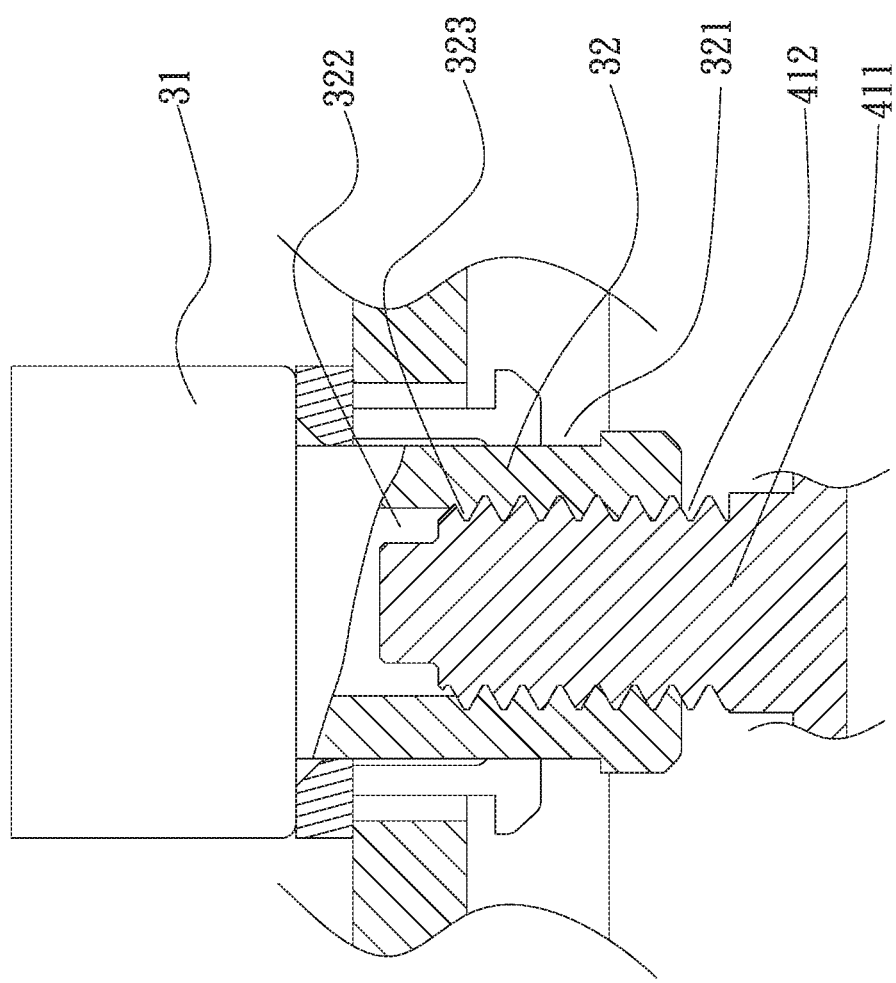
FIG. 13 is a schematic view of the operation of the present invention.

Referring to FIGS. 12, 13, there are shown schematic views of the operation of the present invention. Referring to FIGS. 1~11, in this embodiment, a heat dissipation unit 2, a component 1 coupled to a heat dissipation unit, a screwing element 3, an electronic circuit substrate 4, and a stand 41 disposed on the electronic circuit substrate 4 are provided.

The heat dissipation unit 2 has a first lateral surface 21, a second lateral surface 22 and a plurality of apertures 23. The apertures 23 are not only arranged in a manner to exhibit either bilateral symmetry or vertical symmetry but also penetrate the first and second lateral surfaces 21, 22 of the heat dissipation unit 2, respectively.

At least a bolt 411 is disposed at the stand 41 and corresponds in position to the apertures 23. A plurality of external threads 412 is disposed at the rim of the at least a bolt 411.

The screwing element 3 has a head portion 31 and a body portion 32. The head portion 31 and the body portion 32 are connected to each other. The outer diameter of the head portion 31 is larger than the outer diameter of the body portion 32. The body portion 32 further has a step recess 321 circumferentially disposed at the rim of the body portion 32. An inner hole 322 is disposed at the end of the body portion 32 and has a plurality of internal threads 323.

The stand 41 is disposed in the vicinity of a heat source 42 disposed on the electronic circuit substrate 4.

An assembly process entails inserting the components 1 coupled to a heat dissipation unit into the apertures 23, respectively, attaching the stop portion 12 of the body 11 to the first lateral surface 21 of the heat dissipation unit 2, clasping the first outer engagement portion 15 to the second lateral surface 22 of the heat dissipation unit 2, and inserting the body portion 32 of the screwing element 3 into the through hole 16 of the component 1 coupled to a heat dissipation unit body 11 in a manner to allow the head portion 31 of the screwing element 3 to correspond in position to one side of the first lateral surface 21 of the heat dissipation unit 2 which abuts against the stop portion 12. The stop portion 12 not only enables the body 11 and the first lateral surface 21 of the heat dissipation unit 2 to get attached to each other but also functions as a washer for use in tightening the screwing element 3 to prevent the screwing element 3 from loosening after assembly.

The checking plates 131 of the first inner engagement portion 13 of the body 11 are in contact with the step recess 321 of the body portion 32 of the screwing element 3 and are capable of axial limitation. The second inner engagement portion 14 of the body 11 abuts against the rim attributed to the body portion 32 of the screwing element 3 and corresponding in position to the step recess 321 to prevent the retraction and disconnection of the second part 11b of the body 11 from the through hole 16 of the component 1 coupled to a heat dissipation unit body 11. Finally, the internal threads 323 of the inner hole 322 disposed at the end of the screwing element 3 mesh with the external threads 412 disposed at the rim of the bolt 411; hence, before the screwing element 3 is tightened, the screwing element 3 is unlikely to get disconnected from the heat dissipation unit 2 during the transport thereof.

Figure 14:
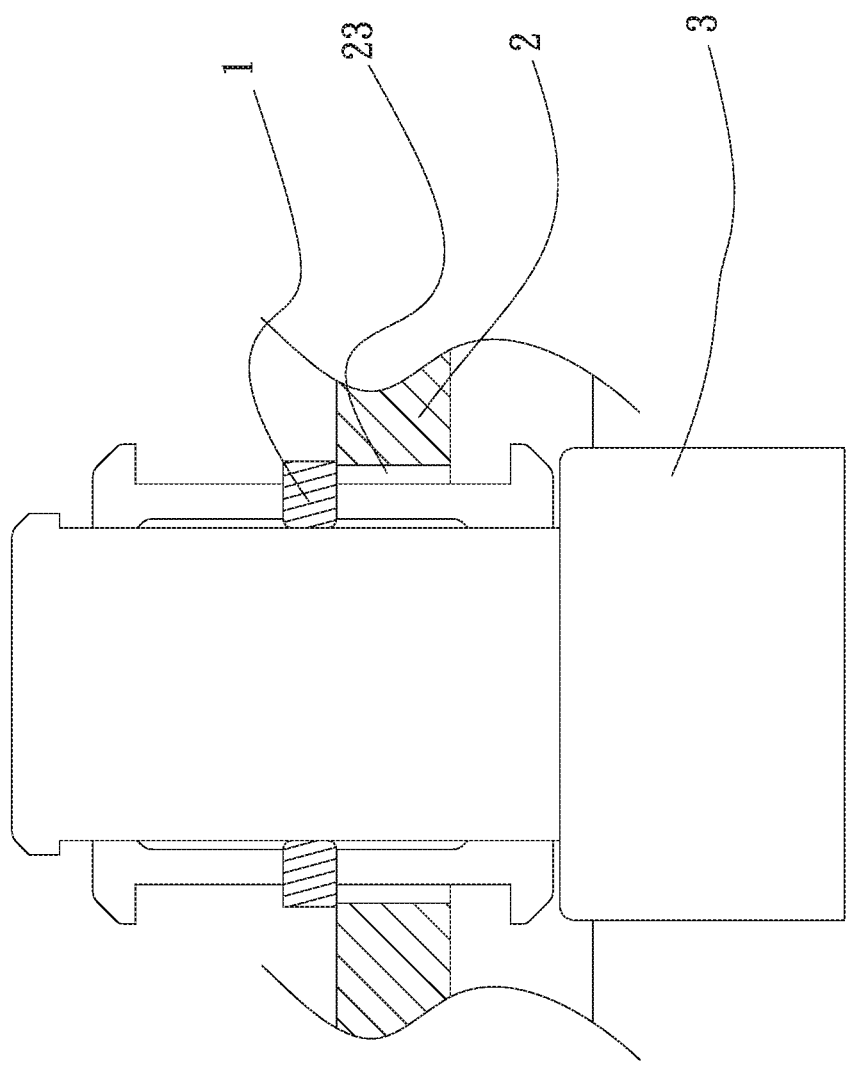
FIG. 14 is a schematic view of the operation of the present invention.

Referring to FIG. 14, there is shown a schematic view of the operation of the present invention. Referring to FIGS. 1~11, this operation embodiment and the preceding embodiment share the same technical features, except that this embodiment is characterized in that: the component 1 coupled to a heat dissipation unit has the structural aspect of the fourth embodiment and has two ends coupled to the screwing element 3; hence, the two ends of the component 1 coupled to a heat dissipation unit are penetratingly disposed at the apertures 23 formed on the heat dissipation unit 2 and thus are no longer subjected to a directional limitation, thereby rendering both the two ends available.

Figure 15:
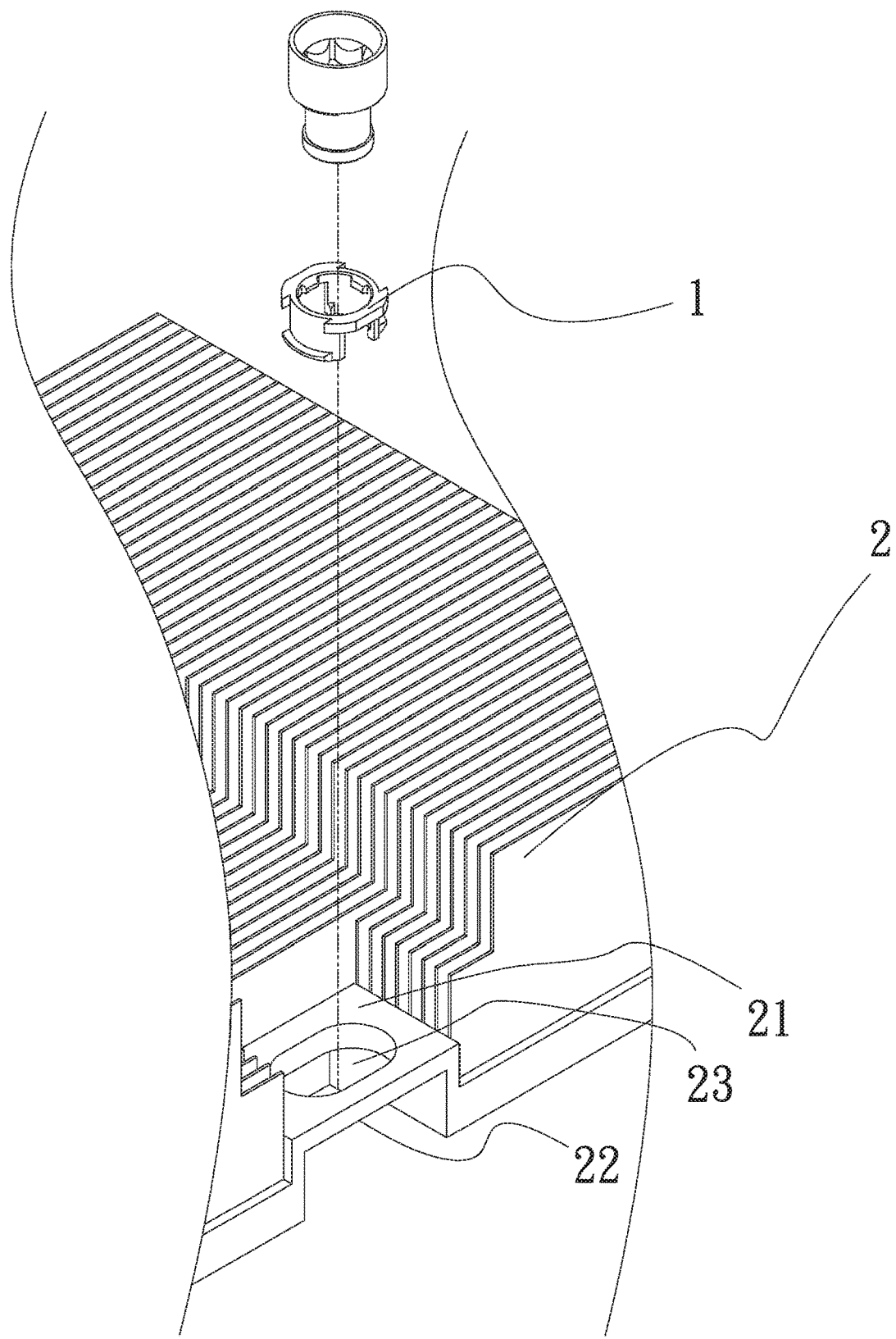
FIG. 15 is a schematic view of the operation of the present invention.

If the apertures 23 disposed on the heat dissipation unit 2 are not round in shape, the cross sections of the component 1 coupled to a heat dissipation unit can be non-round in shape to thereby prevent the component 1 coupled to a heat dissipation unit from rotating radially relative to the apertures 23 disposed at the heat dissipation unit 2 (as shown in FIG. 15).

What is claimed is:

1. A component coupled to a heat dissipation unit, allowing a screwing element to be pivotally coupled to a heat dissipation unit, the component comprising:
   a body having a first part, a second part, and a third part connected to the first part with the first and second part connected to each other and disposed at two ends of the body, respectively, the body forming therein a through hole extending axially to penetrate the first second, and third parts of the body;
   a plurality of stop portions circumferentially disposed at a rim of the first part and extending radially outward therefrom;
   a first inner engagement portion having a plurality of checking plates each extending from a through-hole-defining inner wall of the body towards a center of the through hole radially, with each checking plate of the first inner engagement portion corresponding in position to a respective stop portion; and
   an elongate second inner engagement portion axially extending between the first and second parts and having a plurality of stop blocks, each stop block extending from the through-hole-defining inner wall of the body towards the center of the through hole radially;
   an annular first outer engagement portion disposed at the second part and formed by extending a rim of the body outward, the first outer engagement portion having a first surface and a second surface which is curved or oblique; and
   a second outer engagement portion disposed at a rim of a free end of the third part and extending outwardly therefrom the second outer engagement portion having a conical surface disposed on a top surface of the second outer engagement portion.

* * * * *